United States Patent
Hansen et al.

(10) Patent No.: US 8,964,892 B2
(45) Date of Patent: Feb. 24, 2015

(54) APPARATUS AND METHOD FOR OPERATING A TRANSMITTER

(75) Inventors: Niels-Henrik Lai Hansen, Frederiksberg (DK); Mikkel Christian W. Hoyerby, Kobenhavn SV (DK)

(73) Assignee: Motorola Solutions, Inc., Schaumburg, IL (US)

( * ) Notice: Subject to any disclaimer, the term of this patent is extended or adjusted under 35 U.S.C. 154(b) by 677 days.

(21) Appl. No.: 13/215,884

(22) Filed: Aug. 23, 2011

(65) Prior Publication Data

US 2013/0051492 A1  Feb. 28, 2013

(51) Int. Cl.
| | | |
|---|---|---|
| H04K 1/02 | (2006.01) | |
| H04L 25/03 | (2006.01) | |
| H04B 1/04 | (2006.01) | |
| H03F 1/32 | (2006.01) | |
| H03F 3/189 | (2006.01) | |
| H03F 3/24 | (2006.01) | |

(52) U.S. Cl.
CPC .......... *H04B 1/0475* (2013.01); *H03F 1/3247* (2013.01); *H03F 1/3294* (2013.01); *H03F 3/189* (2013.01); *H03F 3/245* (2013.01); *H03F 2200/336* (2013.01); *H03F 2200/408* (2013.01); *H04B 2001/0433* (2013.01)
USPC ............ 375/297; 375/296; 375/294; 375/316

(58) Field of Classification Search
CPC .... H03F 1/3247; H03F 1/3284; H03F 1/3294
USPC .................................................. 375/297, 259
See application file for complete search history.

(56) References Cited

U.S. PATENT DOCUMENTS

| | | | |
|---|---|---|---|
| 5,066,923 | A | 11/1991 | Gailus et al. |
| 5,396,196 | A | 3/1995 | Blodgett |
| 5,574,994 | A | 11/1996 | Huang et al. |
| 5,584,059 | A | 12/1996 | Turney |
| 5,675,286 | A | 10/1997 | Baker et al. |
| 5,783,968 | A | 7/1998 | Melton |
| 6,081,698 | A | 6/2000 | Moriyama et al. |

(Continued)

FOREIGN PATENT DOCUMENTS

| | | |
|---|---|---|
| EP | 2019486 A1 | 1/2009 |
| GB | 2329085 A | 3/1993 |

(Continued)

OTHER PUBLICATIONS

International Search Report and Written Opinion for related counterpart International Patent application No. PCT/US2010/060921 mailed on Jun. 21, 2011.

(Continued)

*Primary Examiner* — Qutbuddin Ghulamali
(74) *Attorney, Agent, or Firm* — Barbara R. Doutre (57) ABSTRACT

A linear transmitter includes a closed loop feedback path to maintain linearity of a power amplifier subsystem. The closed loop feedback path provides RF injection of one or more reference RF carrier signals (172, 174) combined with a radio frequency (RF) feedback signal (149) to generate a feedback RF error signal (173). A narrowband receiver (170) continuously monitors stability of the feedback RF error signal (173). A loop phase adjusting circuit (188) generates phase adjustments (189) to compensate for instabilities in the closed loop feedback path thereby maintaining stability of the PA RF output signal (146).

10 Claims, 5 Drawing Sheets

(56) References Cited

U.S. PATENT DOCUMENTS

| | | | |
|---|---|---|---|
| 6,084,468 | A | 7/2000 | Sigmon et al. |
| 6,606,483 | B1 | 8/2003 | Baker et al. |
| 6,941,118 | B2 | 9/2005 | Yamamoto |
| 6,987,954 | B2 | 1/2006 | Nielsen |
| 7,177,366 | B1 | 2/2007 | Dawson et al. |
| 7,280,805 | B2 | 10/2007 | Xu et al. |
| 7,400,690 | B2 | 7/2008 | Sun et al. |
| 7,433,420 | B1 | 10/2008 | Dakshinamurthy et al. |
| 7,542,519 | B2 | 6/2009 | McCallister |
| 7,657,236 | B2 | 2/2010 | Pan |
| 8,090,036 | B2 | 1/2012 | Okada et al. |
| 8,229,372 | B2 | 7/2012 | Hoyerby et al. |
| 8,238,846 | B2 | 8/2012 | Hansen et al. |
| 2001/0041546 | A1 | 11/2001 | Kazakevich |
| 2004/0132424 | A1 | 7/2004 | Aytur et al. |
| 2004/0137856 | A1 | 7/2004 | Kanazawa et al. |
| 2004/0250192 | A1 | 12/2004 | Kanazawa |
| 2005/0110567 | A1 | 5/2005 | Rabinovich et al. |
| 2006/0050810 | A1 | 3/2006 | Haque et al. |
| 2007/0042728 | A1 | 2/2007 | Pan |
| 2007/0111682 | A1 | 5/2007 | Mucke |
| 2008/0280579 | A1 | 11/2008 | Cloutier et al. |
| 2009/0129446 | A1 | 5/2009 | Wilhite et al. |
| 2010/0323641 | A1 * | 12/2010 | Aparin et al. ............... 455/114.3 |
| 2011/0201287 | A1 | 8/2011 | Pratt et al. |

FOREIGN PATENT DOCUMENTS

| | | | |
|---|---|---|---|
| JP | 2008236641 | A * | 10/2008 |
| JP | 20080236641 | A | 10/2008 |
| WO | 97/28598 | A1 | 8/1997 |
| WO | 2004057754 | A1 | 7/2004 |

OTHER PUBLICATIONS

Hoyerby et al. "High-Bandwidth, High-Efficiency Envelope Tracking Power Supply for 40w Rf Power Amplifier Using Paralleled Bandpass Current Sources," IEEE Power Electronics Specialists Conference, pp. 2804-2809, Jun. 16, 2005.

Johansson et al., "Linearization of Multi-Carrier Power Amplifiers," 43rd IEEE Conference on Vehicular Technology, pp. 684-687, May 18-20, 1993.

Pipilos et al., "A Transmitter IC for TETRA Systems Based on a Cartesian Feedback Loop Linearization Technique," IEEE Journal of Solid-State Circuits, vol. 40, No. 3, pp. 718, Mar. 2005.

Notice of Allowance mailed on Apr. 2, 2012 in related U.S. Appl. No. 12/725,101, Mikkel Christian Wendelobe Hoyerby, filed on Mar. 16, 2010.

U.S. Appl. No. 12/725,101, filed Mar. 16, 2010—Specification and Drawing—33 pages.

International Search Report and Written Opinion for related Patent Application No. PCT/US2010/057314 mailed on Feb. 9, 2011.

Notice of Allowance mailed on Apr. 25, 2012 in related U.S. Appl. No. 12/641,596, Niels Hansen, filed Dec. 18, 2009.

International Search Report and Written Opinion for related counterpart International Patent application No. PCT/US2012/050712 mailed on Nov. 5, 2012.

Peter B. Kenington, et al., "Noise Performance of a Cartesian Loop Transmitter", IEEE Transactions on Vehicular Technology, IEEE Service Center, Piscataway, NJ, US., vol. 46., No. 2, May 1, 1997, XP011063577, ISSN:0018-9545.

* cited by examiner

APPARATUS AND METHOD FOR OPERATING A TRANSMITTER

FIELD OF THE INVENTION

The invention generally relates to a communication system and more particularly to a transmitter utilizing a feedback loop for linear operation.

BACKGROUND OF THE INVENTION

Radio communication devices use antennas to provide for the efficient transmission of radio frequency (RF) communication signals. The transmitter portion of a radio communication device includes a power amplifier to amplify the RF signals before they are coupled to the antenna for transmission. For some modulation techniques, linear amplification is desired to prevent distortion of the modulated signal. However, when RF power amplifiers are operated in their most efficient manner at high drive levels, they usually provide a nonlinear "compression" characteristic. This means that a change in the amplitude of a signal sent into the power amplifier results in a non-proportional change in the amplitude of the signal out of the amplifier, and therefore causes distortion of the signal.

One manner of improving the linearity of a RF transmitter is to use a Cartesian feedback system, whereby a feedback signal path is provided to create a negative feedback within the transmitter which compensates for the compression in the power amplifier. However, the stability associated with Cartesian feedback is influenced by outside factors, such as the reflected signals at the antenna and temperature drift.

In some Cartesian feedback systems, the base station interrupts normal communication traffic and uses half a slot to linearize or train itself. What is transmitted is typically left up to the manufacturer to define. The utilization of a training slot can be intrusive to others and lowers the useful throughput if done too often.

Multicarrier systems present additional design challenges as Cartesian feedback incurs additional delays making the ability to maintain stability difficult. If several carriers are transmitted through the same transmitter the carriers have to be synchronized so that signals are not destroyed. This synchronization might not be possible if signals are carrying modulation having different protocols. Factors like thermal drift may make it difficult to maintain stability.

Accordingly, it would be highly desirable to have an improved means of operating a transmitter.

BRIEF DESCRIPTION OF THE FIGURES

The accompanying figures where like reference numerals refer to identical or functionally similar elements throughout the separate views and which together with the detailed description below are incorporated in and form part of the specification, serve to further illustrate various embodiments and to explain various principles and advantages all in accordance with the present invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE INVENTION

Before describing in detail embodiments that are in accordance with the present invention, it should be observed that the embodiments reside primarily in combinations of method steps and apparatus components related to a method for monitoring the stability of a feedback loop within a transmitter and taking corrective action without influencing an on-going transmission. The method and apparatus disclosed herein allow stability monitoring and control without relying on assigned training slots. While the feedback loop provided herein can operate in single carrier systems, it is particularly advantageous in multicarrier systems, such as multicarrier system for (TErrestrial Trunked RAdio) TETRA systems.

Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

In the description herein, numerous specific examples are given to provide a thorough understanding of various embodiments of the invention. The examples are included for illustrative purpose only and are not intended to be exhaustive or to limit the invention in any way. It should be noted that various equivalent modifications are possible within the spirit and scope of the present invention. One skilled in the relevant art will recognize, however, that an embodiment of the invention can be practiced with or without the apparatuses, systems, assemblies, methods, components mentioned in the description.

Figure 1:
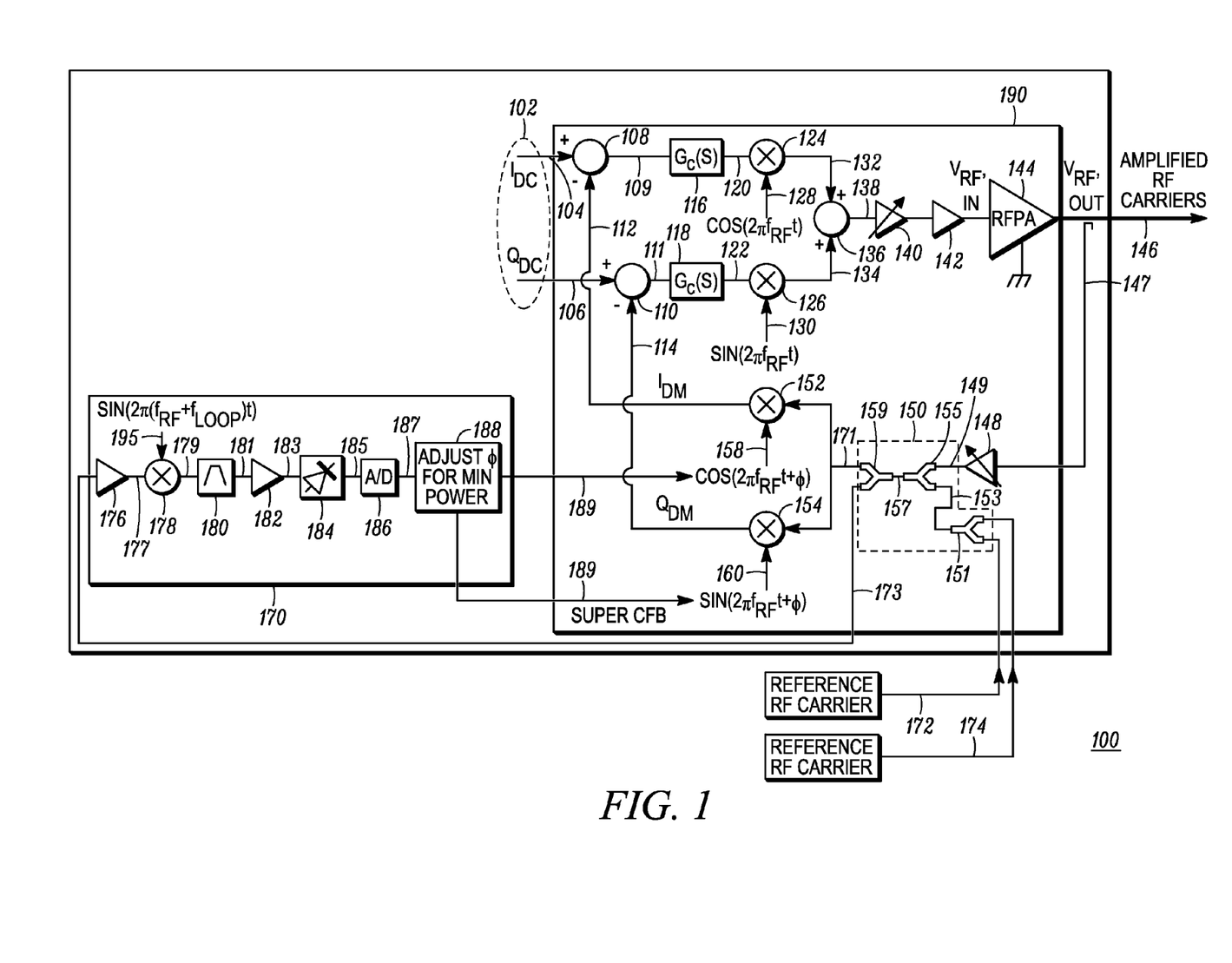
FIG. 1 is a block diagram of a power amplifier subsystem having a closed feedback loop for tuning of a Cartesian system formed and operating in accordance with an embodiment.

FIG. 1 is a block diagram of a transmitter 100 in accordance with an embodiment. Transmitter 100 comprises a tuner 170 and a Cartesian feedback block 190. The tuner 170 provides stability monitoring and correction. The Cartesian feedback block 190 is injected with one or more reference RF carrier signals, shown here as first and second low level reference RF signals 172, 174, containing one or more carriers to be amplified.

In operation, the drive signal of the Cartesian feedback block is input at baseband as a complex baseband signal 102 having an in-phase ($I_{DC}$) component 104 and a quadrature ($Q_{DC}$) component 106. Each of the $I_{DC}$ and $Q_{DC}$ components 104, 106 are summed 108, 110 with respective demodulated complex feedback signals 112, 114 to generate phase compensated complex baseband signals 109, 111 respectively. Phase compensated complex baseband signals 109, 111 are separately filtered through filters 116, 118. Filters 116, 118 may be high order compensation networks, such as networks $G_c(s)$, to provide attenuation of harmonics to the phase compensated complex baseband signals 109, 111 and alter the shape of the frequency response. Filtered signals 120, 122 are applied to quadrature up-converters 124, 126 respectively for mixing with injected LO signals 128, 130 respectively. LO signals 128, 130 are phase shifted 90 degrees with respect to each other. The quadrature up-converters 124, 126 translate the components to first and second phase shifted RF frequencies 132, 134 respectively. The phase shifted signals 132, 134 are summed 136 into an RF signal 138 which is then applied to a variable gain amplifier 140, pre-amplifier 142 and RF amplifier 144 to generate an RF output 146, also referred to as an amplified RF carrier. The RF output 146 is sent to an antenna for transmission.

To create a feedback loop, the RF output 146 from the RF power amplifier 144 is fed back through an RF coupler 147 (with inherent losses associated therewith e.g. 10 dB) to a variable gain amplifier 148 to produce RF feedback signal 149. Variable gain amplifier 148 is used to adjust the amplified level of signal 147 to correspond with the amplitude level of the reference RF carrier signals 172, 174. As such, the RF feedback signal 149 (which is a representation of the RF signal at the antenna) will approximate the amplitude of the RF carrier signals. In accordance with the embodiments, RF feedback signal 149 and reference RF carrier signals 172, 174 are applied to a power splitter/combiner block 150.

The reference RF carrier signals 172 and 174 can be generated from modulators at low level. This can be done, for example, using IQ modulators followed by low level amplifiers possible with Cartesian feedback. Reference RF carrier signals 172 and 172 are independent signals at different frequencies within the same loop bandwidth. Reference RF carrier signals 172 and 172 are summed at combiner 151 and fed to the loop summation point at combiner 155. Combiner 155 sums RF feedback signal 149 with the summed RF carrier signals 153 to generate an error output signal 157. Thus, if the antenna signal, RF output 146, is an exact replica of the reference RF carrier signals 172, 174 at a higher level, the error signal 157 would be zero.

The error signal 157 contains all artifacts but the desired RF signal will be low in amplitude since it is subtracted from the reference. The error signal 157 is then power split at splitter 159 (again with some associated losses, e.g. 3 dB) into two signal paths, as signals feedback RF error signal 171 and feedback RF error signal 173, which are identical. Feedback RF error signal 171 is applied to quadrature downmixer pair 152, 154, and feedback RF error signal 173 is fed back to tuner 170.

Feedback quadrature down-converter 152, 154 mix the feedback RF error signal 171 with injected LO signals 158, 160 respectively. LO signals 158, 160 are phase shifted ninety degrees with respect to LO signals 128, 130. The feedback quadrature down-converters 152, 154 translate the feedback RF error signal 171 into the demodulated complex feedback baseband signals $I_{DM}$ 110 and $Q_{DM}$ 112. The demodulated complex feedback baseband signals, $I_{DM}$ 110 and QDM 112, are then summed with the DC offset signals $I_{DC}$, $Q_{DC}$ 104, 106 respectively to generate the phase compensated complex base band signals 109, 111.

A correct phase relationship is required between the local oscillator (LO) signals 128, 130, 158, 160 that are used for driving the quadrature up-converter 124, 126 and feedback quadrature down-converter 152, 154. To set the correct phase relationship, phase correction is performed in accordance with the embodiments by inserting the feedback RF error signal 171 to the input to the feedback quadrature down-converter 152, 154, with a predetermined phase set by a digital signal processor (DSP) 188. In accordance with the embodiments, at no point in time is the loop open. The initial phase is predetermined, such as by training scheme or a known good value. This initial phase value is accurate enough so that the loop is not oscillating.

Throughout the continuous closed loop operation, the tuner 170 is applied in a feedback path to receive and monitor the feedback RF error signal 173 and provide a phase correction via DSP 188 to apply back to the LO signals 158, 160 for feedback downmixer pair 152, 154. The DSP 188 is also referred to as a loop phase adjustment circuit as part of tuner 170. In accordance with the embodiments, tuner 170 monitors stability of the loop at feedback RF error signal 173 and generates corrected phase shifts for LO signals 158, 160 to apply to the feedback downmixer pair 152, 154.

The tuning process at tuner 170 operates by applying the feedback RF error signal 173 to pre-amplifier 176 to generate amplified feedback RF error signal 177. Mixer 178 mixes amplified feedback RF error signal 177 with LO offset signal 195. LO offset signal 195 is a continuous waveform (CW) signal generated by a local oscillator locked by a PLL (not shown). The LO offset signal 195 provides an offset corresponding to a point where the open loop has 0 dB gain (referred to as the corner frequency). By design the location of the 0 dB open loop gain is known, but in accordance with the embodiments, at no point is the loop open. Though not part of the phase tuning per se, the LO offset 195 provides a way to measure at both + and − offset and to avoid spurs and outside noise. Thus, tough starting with a known predetermined value, in a practical scenario the ability to adjust the LO offset 195 is provided to minimize influence of spurs and outside disturbances.

Continuing with the tuning process of tuner 170, the mixer 178 generates IF signal 179. The IF signal 179 is filtered through bandpass filter 180 to provide filtered IF output 181 which is then amplified at IF amplifier 182. Amplified IF signal 183 goes through RF power detector 184 for detecting peaks in the IF power. A detected peak signal 185 goes through an analog to digital (A/D) converter 186 to produce a digital signal 187 which is a digitized repetition of the detected peaks in the IF signal. These digitized peaks thus represent a digital representation of the artifacts that are present in the signal. Digital signal 187 is applied to a DSP 188 where the digitized peaks are adjusted for minimum power. This phase adjustment represents a corrected phase shift which is then applied to the LO signals 158, 160. Then narrowband receiver of tuner 170 turns on and remains on providing continuous monitoring and phase adjustment.

The use of the tuner 170 provides a small narrowband selective receiver with which to continuously monitor the stability of the feedback RF error signal 173. Again, the feedback RF error signal 173 is an ideal signal to monitor in that it has all artifacts but is low in amplitude. The DSP 188 thus continuously measures the power of the IF signal and adjusts/corrects the phase for the phase of down-converter LO signals 158, 160 based on the relationship between the feedback RF error signal 173 and LO offset signal 195. When the phase margin gets worse, power monitored at this offset will increase. When the phase margin gets close to a point of instability, the power monitored at the offset rises dramatically. In accordance with the embodiments, the power is measured continuously and the phase between the forward upmixer pair 124, 126 and the feedback downmixer pair 152, 154 is adjusted to minimize the power level measured. Minimizing this power level maintains a stable loop.

The continuous closed loop response may be represented as follows:

$$G = \frac{A}{1 + AB},$$

where:
G represents the overall gain,
A represents the forward gain,
B represents the reverse gain, and
AB represents the open loop gain.

At the frequency where the product AB approaches 1 (0 dB), the phase becomes very important. As the phase approaches 180 degrees, the denominator will get very close to zero, and the gain will increase. This increase in gain will be seen as an amplification of the noise floor at this frequency offset, as will be shown in FIG. 2. In other words, the higher the power, the worse the stability.

Figure 2:
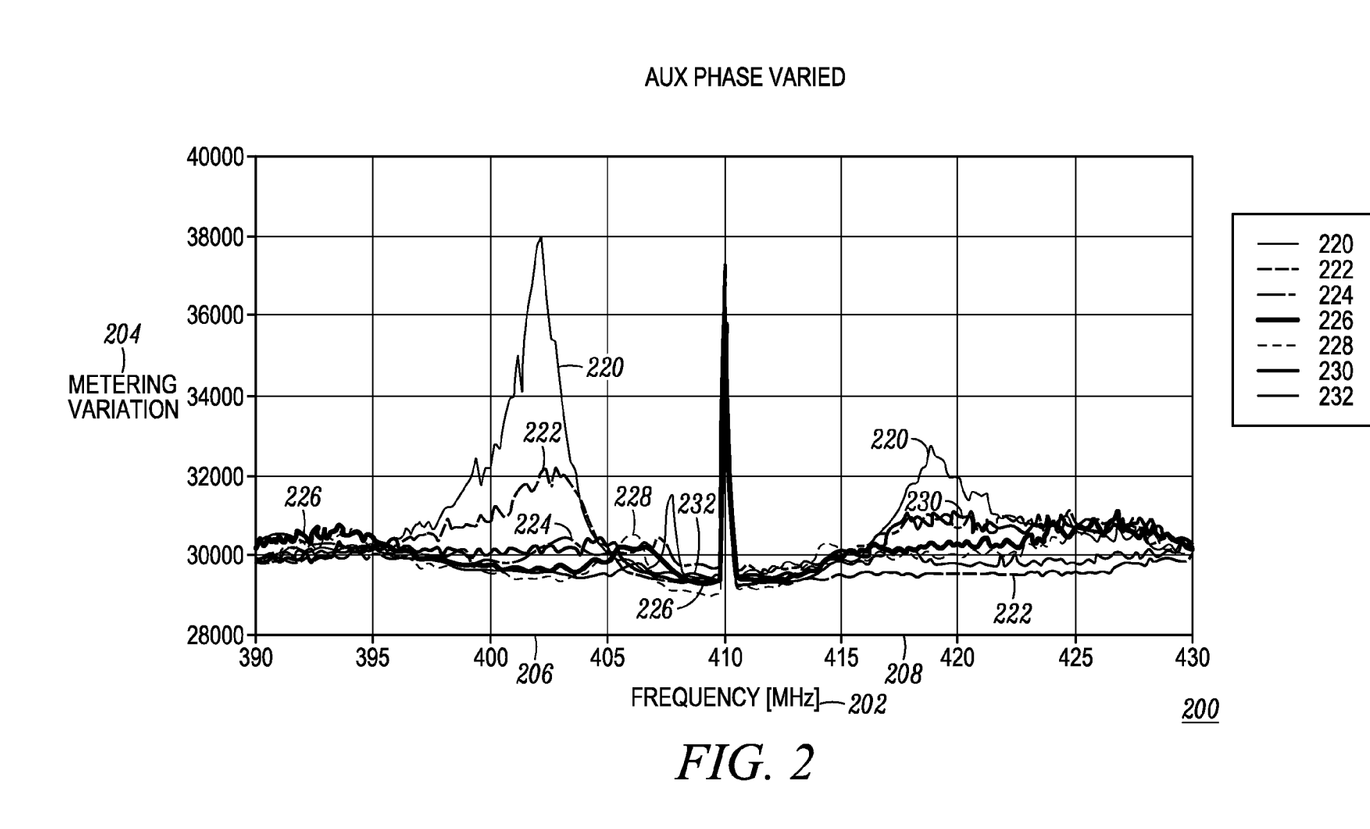
FIG. 2 is a graph of an example of measured noise power versus frequency offset for a Cartesian feedback loop operating in accordance with an embodiment.

FIG. 2 is a graph 200 providing an example of measured noise power versus frequency offset during closed loop operation. Graph 200 represents measurements taken at the feedback RF error signal 173 at the input to the tuner 170. The closed loop operates with the tuner 170 providing stability monitoring and phase correction in accordance with the embodiments. The frequency offset is shown in degrees along the horizontal axis 202 while the metered noise floor is shown along the vertical axis 204 (in A/D converter_units) as the phase is being varied (phase is parameter). Designators 220, 222, 224, 226, 228, 230, and 232 identify measurements taken at different phases during closed loop operation.

As seen in graph 200, the measured result at the loop corner frequency 206, 208 (which is approximately 7.8 MHz in this example) rises dramatically as an instability condition is approached. Peaks shown at 206, 206 are quite visible as the auxiliary phase is varied.

Figure 3:
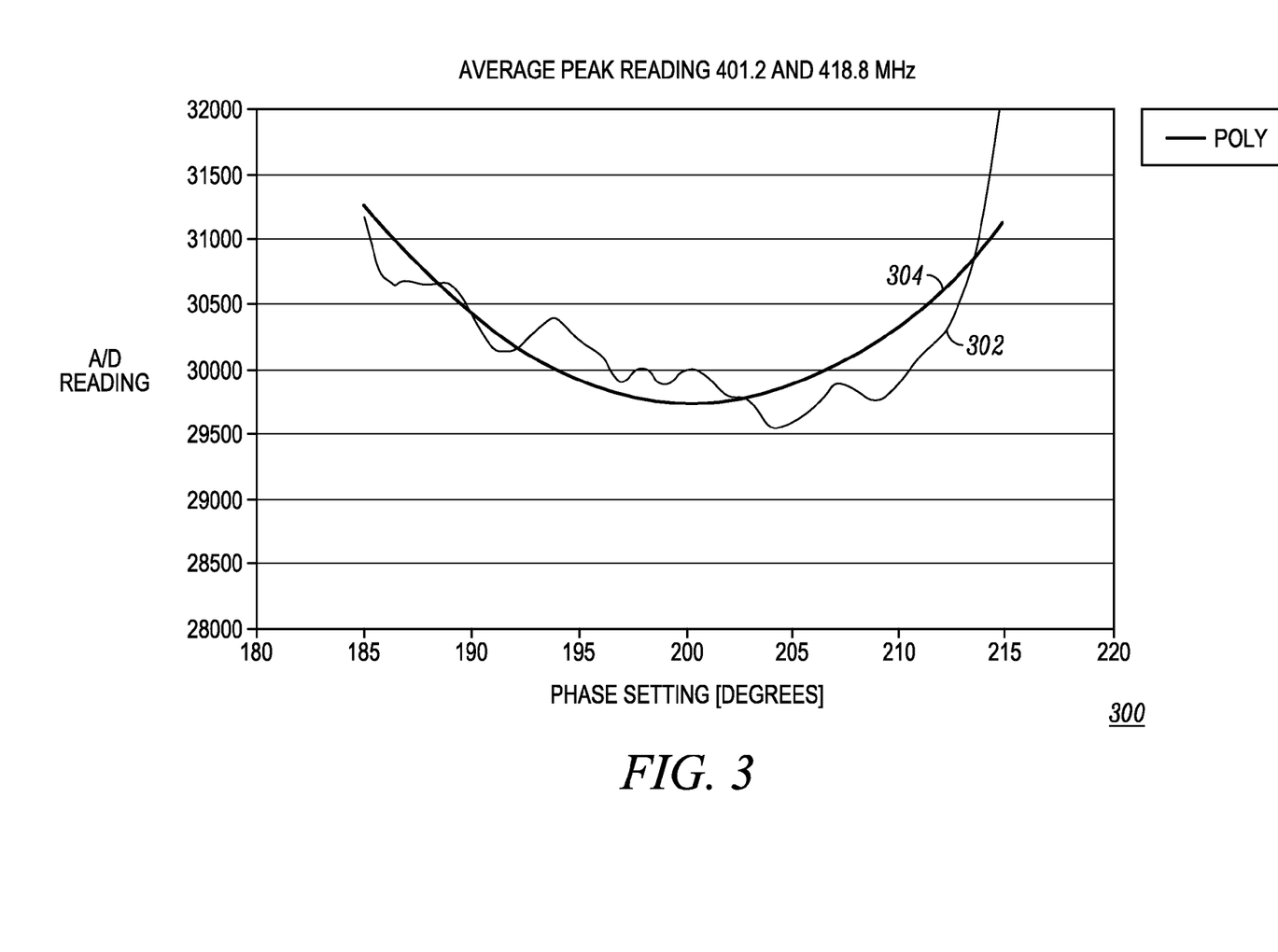
FIG. 3 is a graph of an example of phase offset turning using a polynomial fit in accordance with an embodiment of the invention.

The tuning taking place through tuner 170 can be accomplished using, for example a polynomial fit approach which involves, at DSP 188, measuring the number of points, performing a polynomial fit (typically second order) and then setting the phase to the value that corresponds to the minimum in the polynomial. FIG. 3 illustrates such an example with a graph 300 of phase setting (degrees) versus A/D readings (A/D converter units) taking within tuner 170. Again, tuner 170 provides stability monitoring and corrections for the RF injected feedback loop. The tuning can be accomplished, for example by averaging the reading the +/− offset of 0 dB loop gain (designator 302) and applying a polynomial fit 304 to the readings. The minimum of this polynomial is then the taken as a desired phase setting with which to apply to the LO for the feedback downmixer pair 152, 154.

Figure 4:
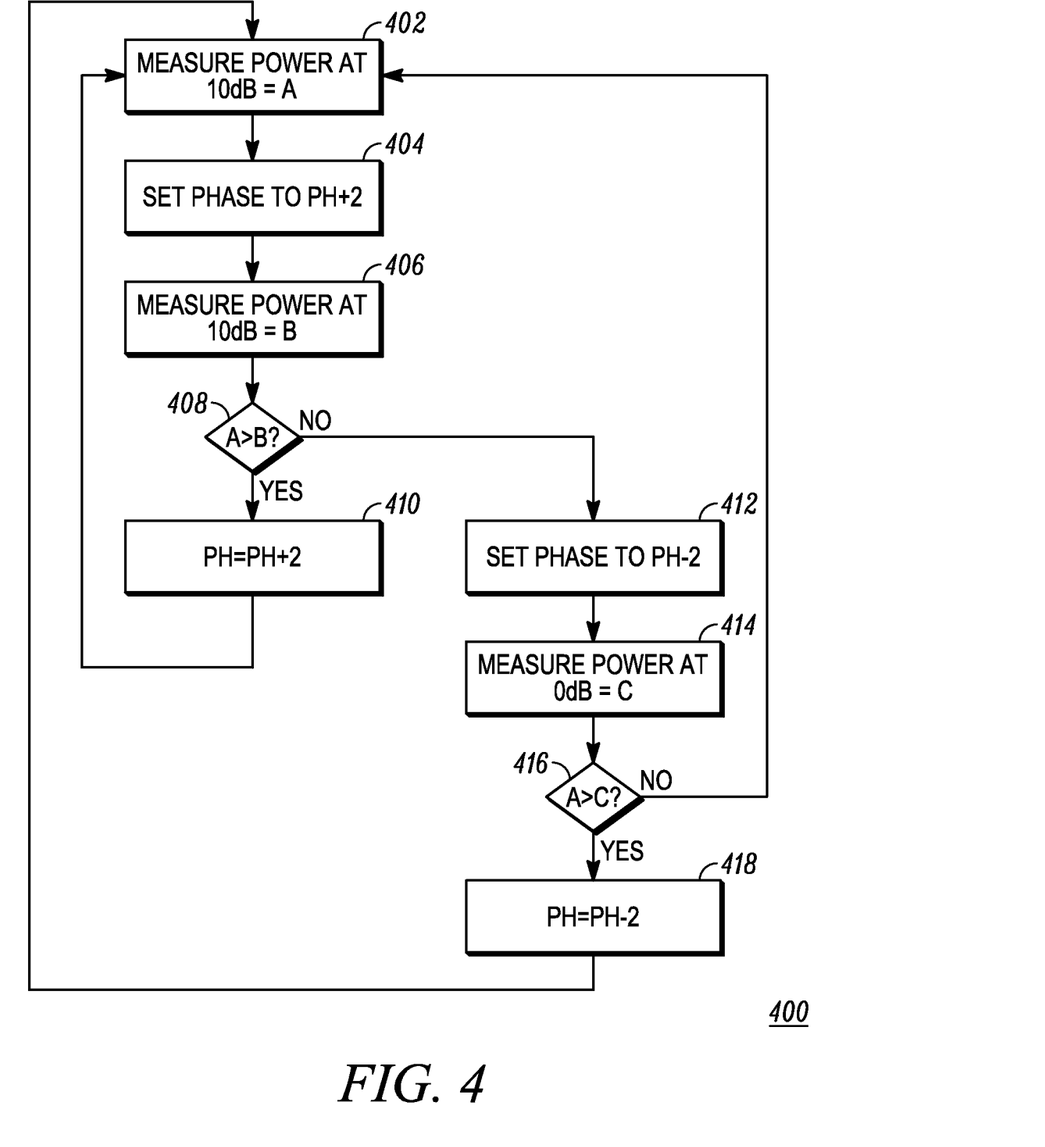
FIG. 4 is a flowchart providing an example of a phase offset tuning using averaging in accordance with the various embodiments.

FIG. 4 is a flowchart 400 providing another example of a phase offset tuning method appropriate for the transmitter in accordance with the various embodiments. In this example, power is measured at both plus and minus the 0 dB loop gain offset and averaged. On entry at 402 the phase has a value of PH which is the initial phase where power (A) is measured. The phase is incremented, for example, in steps of two degrees at 404 and the power (B) is re-measured at 406. The initial power measurement is compared to the phase adjusted power measurement at 408. The phase is then either incremented at 410 and then returned to 402, or decremented at 412 and then re-measured (C) at 414. If the initial power measurement (A) is higher than the last measurement (C), the phase is decremented again at 418 and returned to 402. If the initial power measurement (A) is not higher than the last measurement (C), method returns back to an initial state.

The phase adjustment tuning provided by FIGS. 3 and 4 are just two examples of how the phase tuning can be accomplished. Other techniques may be utilized but all must take into account the peak power levels of the noise floor at the frequency offsets.

Figure 5:
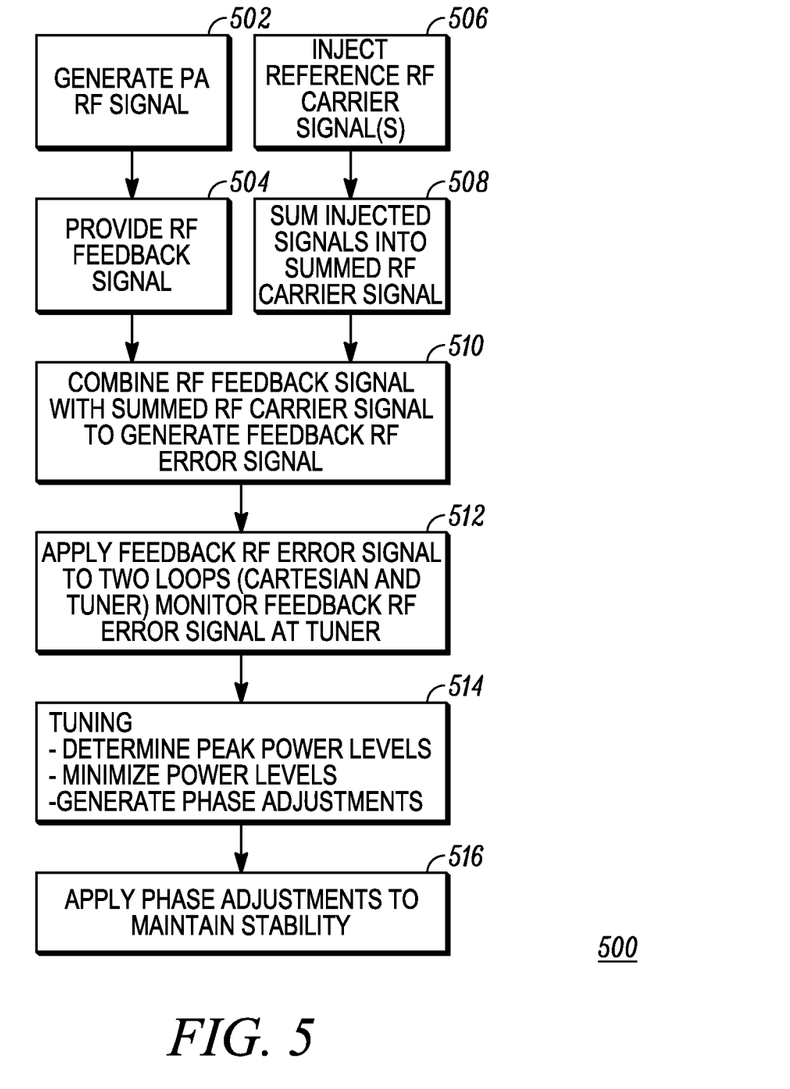
FIG. 5 is a flowchart outlining a method for maintaining stability in a transmitter formed and operating in accordance with the various embodiments.

FIG. 5 is a flowchart outlining the method for maintaining linearity in a transmitter formed and operating in accordance with the various embodiments. Method 500 begins at 502 by generating a power amplified RF signal 146 from Cartesian feedback loop. At 504, an RF feedback signal 149, derived from the PA RF signal, is provided in a feedback path of the transmitter. One or more RF reference carrier signals 172, 174 are injected into the feedback path at 506 and summed at 508 into a summed RF carrier signal 153. At 510, the RF feedback signal 149 is combined with the summed RF carrier signal 153 to generate an RF error signal 157. The RF error signal 157 is split such that identical feedback RF error signals 171 and 173 are fed back through the two loops at 512, the two loops being the Cartesian feedback loop 190 and tuning feedback loop, also referred to as tuner 170. As previously described, tuner 170 comprises a narrowband receiver and phase adjustment circuit. The feedback RF error signal 173 is monitored and adjusted by tuner 170 at 512. Tuning occurs at 514 by applying the feedback RF error signal to the narrowband receiver to determine the peak noise power levels, minimize these levels, and generate phase adjustments for the LO signals 158, 160 based on the measured noise power. The phase adjustments are applied to the loop to maintain stability at 516.

The tuning 514 can be accomplished, as previously described, by taking the feedback RF error signal 173 and mixing it with LO offset signal 195 to generate an IF signal 179. Filtering the IF signal through bandpass filter 180 to provide filtered IF output 181 which is then amplified by IF amplifier 182. Peak power levels of the amplified IF signal 183 are measured by RF power detector 184. The detected peak power signals 185 are digitized, by (A/D) converter 186 to produce a digital signal 187 which is a digitized repetition of the detected peaks in the IF signal. These digitized peaks thus represent a digital representation of the artifacts that are present in the signal.

Power adjustments are made (at DSP 188) to minimize the peak power levels seen in the narrowband receiver 170. These power adjustments minimize the peak power levels and are used to determine appropriate phase adjustments 189 to be applied to the LO signals 158, 160 fed back in the Cartesian feedback loop 190.

Hence, the overall method 500 provides monitoring and stability maintenance of a linear transmitter having a Cartesian feedback loop by monitoring peak power levels in a narrowband receiver 170 coupled in a feedback path of the Cartesian feedback loop, minimizing the noise measured within the narrowband receiver, and generating a loop phase adjustment value(s) 189 to the Cartesian feedback loop 190.

Accordingly, there has been provided a means for monitoring and adjusting the stability of a linear transmitter in a non-intrusive way. The stability tuning provided by the various embodiments works in both single and multicarrier environment. The method and apparatus as described in the various embodiments allow stability monitoring and control without relying on assigned training slots.

Noise power is kept to a minimum thus maintaining maximum stability within the linear transmitter. The tuning apparatus 170 and method 500 provide optimum stability without having to shut down modulation while the tuning is taking place, thus the tuning can be done continuously. Little selectivity is required due to the unique metering point at the injected reference RF signals input to the tuner 170.

The tuning apparatus 170 and method 500 can be applied to both base stations and subscribers. The ability to utilize a plurality of reference RF carriers enables multicarrier PAs, which is highly desirable, for example, in TETRA systems. Substantial cost reduction is achieved due to elimination of cavity combiners in a base station. Substantial size and weight reduction is also accomplished due to fewer base radios being required and the elimination of cavity combiners.

On the subscriber side, where there may be little or no isolation between the antenna and power amplifier, the optimal phase depends on the load impedance since reflections will alter the feedback signal amplitude and phase. A tuner, operating in accordance with the various embodiments will counteract this effect when operating sufficiently fast enough to track the changes in the reflections. This benefit is more applicable to subscribers, as opposed to base stations which typically have isolators between the PA and antenna.

Those skilled in the art will appreciate that the above recognized advantages and other advantages described herein are merely exemplary and are not meant to be a complete rendering of all of the advantages of the various embodiments of the present invention.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention. The benefits, advantages, solutions to problems, and any element(s) that may cause any benefit, advantage, or solution to occur or become more pronounced are not to be construed as a critical, required, or essential features or elements of any or all the claims. The present invention is defined solely by the appended claims including any amendments made during the pendency of this application and all equivalents of those claims as issued.

What is claimed is:

1. A transmitter, comprising:
a Cartesian feedback loop generating a PA output;
a narrowband receiver coupled within a feedback path of the Cartesian feedback loop;
at least one reference RF carrier signal being injected into the feedback path of the transmitter for combining with a feedback signal of the PA output thereby generating a feedback RF error signal; and
the narrowband receiver monitoring and tuning the feedback RF error signal to maintain stability without the use of training slots, wherein the narrowband receiver measures noise power of the feedback RF error signal, the noise being selectively set at both plus and minus a 0 dB loop gain offset.

2. A transmitter, comprising:
a Cartesian feedback loop having a power amplifier generating a PA output signal and a radio frequency (RF) feedback signal;
a closed loop feedback path to maintain linearity of the PA, the closed loop feedback path comprising:
RF injection of one or more reference carrier signals;
a combiner/splitter circuit for generating a feedback RF error signal based on the one or more RF injection carrier signals and the RF feedback signal;
a tuner comprising:
a narrowband receiver for continuously monitoring stability of the feedback RF error signal; and
a loop phase adjusting circuit coupled to the narrowband receiver, the loop phase adjusting circuit generating a phase adjustment in the closed loop feedback path to maintain stability of the PA output signal.

3. The transmitter of claim 2, wherein the narrowband receiver comprises a selective noise receiver set to receive LO offsets corresponding to a 0 dB open loop gain point.

4. The transmitter of claim 2, wherein the tuner operates continuously without the use of training slots.

5. A method of maintaining linearity in transmitter, comprising:
generating a power amplified radio frequency (RF) signal and providing a radio frequency (RF) feedback signal in a feedback path of the transmitter;
injecting a reference RF carrier signal into the feedback path;
combining the RF feedback signal with the injected reference RF carrier signal to generate a feedback RF error signal;
tuning the feedback RF error signal within the feedback path;
measuring noise power of the feedback RF error signal using a narrowband receiver;
generating a loop phase adjustment based on the measured noise power; and
applying the loop phase adjustment to the transmitter feedback path thereby maintaining linear operation of the transmitter.

6. The method of claim 5, wherein the step of measuring noise power of the feedback RF error signal using the narrowband receiver, comprises:
selectively setting the narrowband receiver to receive noise at offsets corresponding to a 0 dB open loop gain point.

7. The method of claim 6, wherein selectively setting offsets comprises selecting offset points where a predetermined low selectivity is required such that noise measured at the offset points represents a measure of a phase margin.

8. The method of claim 5, wherein the tuning further comprises:
averaging the noise power readings at +/− offset of 0 dB loop gain;
applying a polynomial fit to the averaged noise power readings; and
utilizing a minimum of the polynomial fit as a desired phase setting.

9. The method of claim 5, wherein the tuning further comprises:
averaging the noise power readings at +/− offset of 0 dB loop gain; and
measuring peak power levels of the noise; and incrementing and/or decrementing a phase adjustment value in response to the peak power levels.

10. The method of claim 5, wherein the tuning operates continuously without the use of training slots.

* * * * *